United States Patent
Ikeda et al.

(10) Patent No.: US 10,477,745 B2
(45) Date of Patent: Nov. 12, 2019

(54) HOLDING DEVICE FOR TOOLS REQUIRED FOR COMPONENT SUPPLY

(71) Applicant: FUJI CORPORATION, Chiryu (JP)

(72) Inventors: Mitsutoshi Ikeda, Nagoya (JP); Atsushi Yamazaki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 41 days.

(21) Appl. No.: 15/579,719

(22) PCT Filed: Jun. 8, 2015

(86) PCT No.: PCT/JP2015/066509
§ 371 (c)(1),
(2) Date: Dec. 5, 2017

(87) PCT Pub. No.: WO2016/199199
PCT Pub. Date: Dec. 15, 2016

(65) Prior Publication Data
US 2018/0184554 A1  Jun. 28, 2018

(51) Int. Cl.
*H05K 13/02* (2006.01)
*H05K 13/04* (2006.01)

(52) U.S. Cl.
CPC ......... *H05K 13/02* (2013.01); *H05K 13/0417* (2013.01)

(58) Field of Classification Search
CPC .......................... H05K 13/02; H05K 13/0417
See application file for complete search history.

(56) References Cited

U.S. PATENT DOCUMENTS

2009/0074550 A1* 3/2009 Yamasaki .......... H05K 13/0417
  414/595
2010/0290870 A1* 11/2010 Ezure .................... B65G 65/00
  414/222.04

FOREIGN PATENT DOCUMENTS

| JP | 08-204385 A | 8/1996 |
|---|---|---|
| JP | 2004-228207 A | 8/2004 |
| JP | 2006-100695 A | 4/2006 |
| JP | 2006-108420 A | 4/2006 |
| JP | 2009-266990 A | 11/2009 |
| JP | 2012-079842 A | 4/2012 |

OTHER PUBLICATIONS

International Search Report dated Sep. 1, 2015, in PCT/JP2015/066509 filed Jun. 8, 2015.

* cited by examiner

*Primary Examiner* — Sang K Kim
(74) *Attorney, Agent, or Firm* — Oblon, McClelland, Maier & Neustadt, L.L.P.

(57) ABSTRACT

A holding device for tools required for component supply includes: a feeder attachment table on which multiple tape feeders are attached lined up in a lengthwise direction; a first reel holder provided at a rear side of the feeder attachment table and which holds lined up multiple tape reels on which a component holding tape is wound; a second reel bolder provided below the first reel holder and which bolds lined up multiple of tape reels; and a second holder movement allowance mechanism which allows the second reel holder to move upwards, such that the second reel holder is positioned at a rear side of the first reel holder. A waste tape collection device arranged in front of the second reel holder below the feeder attachment table can be removed from the rear side of the waste tape collection device.

9 Claims, 5 Drawing Sheets

HOLDING DEVICE FOR TOOLS REQUIRED FOR COMPONENT SUPPLY

TECHNICAL FIELD

The present disclosure relates to a component supply device for supplying electronic circuit components to a component mounter that mounts the electronic circuit components on a board, in particular, to a device for holding tools that are required for supplying the components.

BACKGROUND ART

A component mounter performs work of using a component mounting head to pick up components supplied from a component supply device and mount the components on a circuit board. For example, as disclosed in the patent literature below, there are component mounting devices configured including multiple tape feeders that position a component at a supply position for the component mounting head, and multiple tape reels wound on which is component holding tape that holds multiple components. In recent years, because the types of boards and components is increasing, and component mounting work is becoming faster, it is desirable for many tape reels to be able to be set on a holding device for tools required for component supply such as the above tape feeders and tape reels. The cart used as a holding device for tools required for component supply disclosed in patent literature 1 below is provided with a reel holding section equipped on the rear side of a tape feeder that holds a component holding tape in a manner where supply to the tape feeder is possible, a reel stock section provided below the reel holding section for stocking spare tape reels, and a large reel holding section provided below the reel stock section for holding large reels on which is wound large component holding tape larger than component holding tape that can be held by the reel holding section and the reel stock section. Also, the component supply device disclosed in patent literature 2 below is able to increase the quantity of tape reels that can be set in a given width by positioning multiple of the tape reels at alternating positions in a vertical direction.

CITATION LIST

Patent Literature

Patent literature 1: J P-A-2004-228207
Patent literature 2: JP-A-H8-204385

SUMMARY

In a component supply device configured including a tape feeder and tape reel as above, it is necessary to collect and dispose of waste tape that is tape after components have been picked up from the component holding tape. There is also a problem of an increased amount of waste tape due to the increase in tape reels. Generally, a waste tape collection device for collecting waste tape is provided below a tape feeder, but because with a component mounter that uses the cart disclosed in the above patent literature 1, a reel stock section and a large reel holding section are provided, it is difficult to collect and dispose of waste tape collected in the waste tape collection device. The present disclosure takes account of such circumstances, and an object thereof is to provide a holding device for tools required for component supply for which it is easy to collect and dispose of waste tape.

To solve the above problems, a holding device for tools required for component supply of the present disclosure includes:

a feeder attachment table on which multiple tape feeders are attached lined up in a lengthwise direction, the tape feeders being configured to feed component holding tape that holds multiple components and position multiple of the components respectively at a supply position;

a first reel holder provided at a rear side of the feeder attachment table and configured to hold lined up multiple tape reels on which the component holding tape is wound;

a second reel holder provided below the first reel holder and configured to hold lined up multiple of the tape reels; and a second holder movement allowance mechanism configured to allow the second reel holder to move upwards, wherein the second reel holder is able to be positioned at a rear side of the first reel holder.

As described above, there are cases in which a waste tape collection device is provided on a holding device for tools required for component supply or a component mounter main body on which the holding device for tools required for component supply is set, so as to be positioned below a feeder attachment table and in front of a second reel holder. According to the holding device for tools required for component supply of the present disclosure, by using a second holder moving allowance mechanism to move a second reel holder up and position it to the rear of a first reel holder, it is easy to remove a waste tape collection device to the rear of itself.

Note that, the holding device for tools required for component supply of the present disclosure may be configured such that supplying component holding tape to a tape feeder is possible from one of a first reel holder and a second reel holder, and the other of the first reel holder and the second reel holder is for stocking a tape reel, or may be configured such that supplying component holding tape to a tape feeder is possible from both the first reel holder and the second reel holder. Also, the configuration of the second holder moving mechanism is not particularly restricted, so long as it allows the second reel holder to move upwards, for example, the configuration may be such that an upper section of the second reel holder is rotatable around a fulcrum, or such that the second holder can slide upwards.

BRIEF DESCRIPTION OF DRAWINGS

FIG. 6(a) shows a state with the second reel holder positioned below the first reel holder; FIG. 6(b) shows a state with the second reel holder positioned behind the first reel holder.

DESCRIPTION OF EMBODIMENTS

Hereinafter, an example of a holding device for tools required for component supply that is an embodiment of the present disclosure is described with reference to the drawings. It should be noted that for the present disclosure, as well as the below embodiment, embodiments with various changes based on the knowledge of someone skilled in the art are possible.

Figure 1:
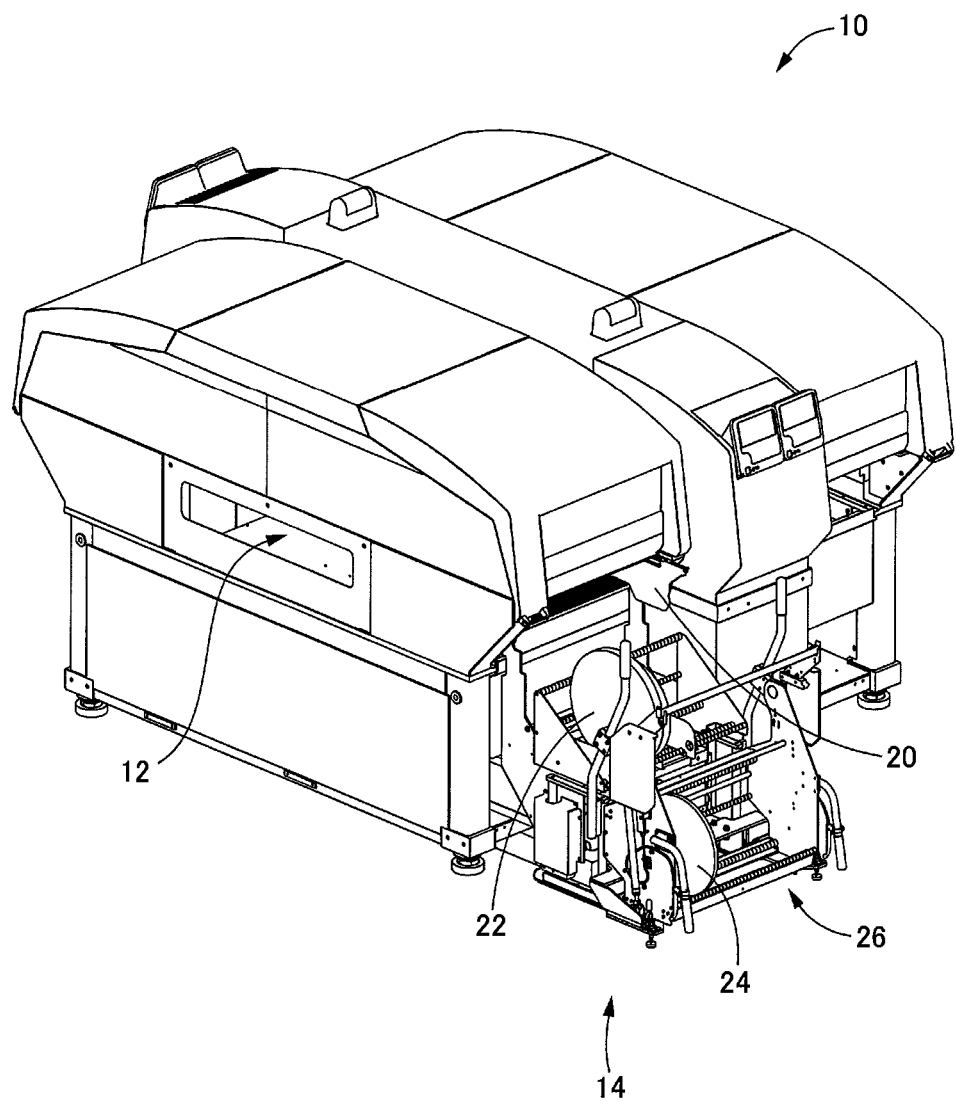
FIG. 1 is a perspective view showing a component mounter that uses a holding device for tools required for component supply that is an embodiment of the present disclosure.

FIG. 1 shows component mounter 10 that uses a holding device for tools required for component supply that is an embodiment of the present disclosure. Although detailed drawings and descriptions are omitted, component mounter 10 performs work of conveying a circuit board loaded into component mounter 10 to a component mounting position using conveyance device 12, and picking up components supplied from component supply device 14 and mounting the components on the circuit board using a component mounting head (not shown). Component mounter 10 includes two component mounting heads, and those two component mounting heads are provided lined up in the direction in which the circuit board is conveyed by conveyance device 12. Note that, in FIG. 1 only one component supply device 14 is shown, but two component supply devices are set, corresponding to the two component mounting heads.

Figure 2:
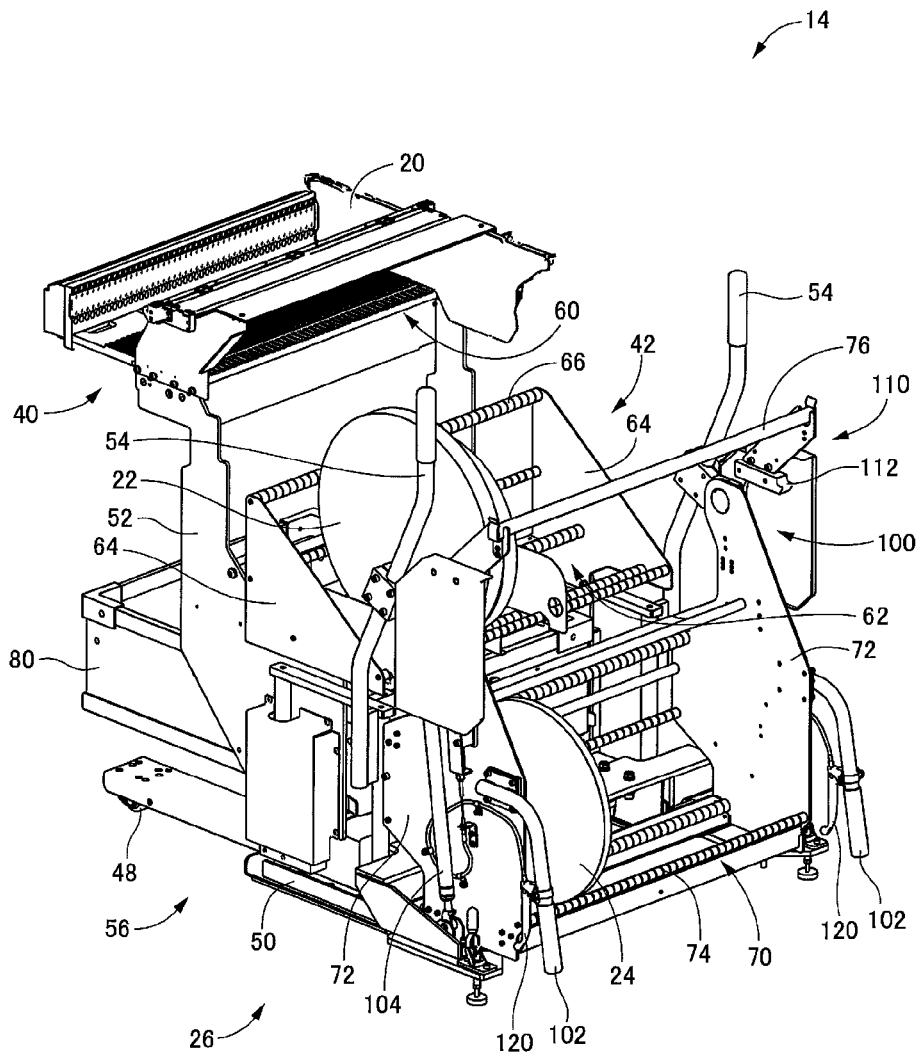
FIG. 2 is a perspective view showing component supply device that uses a holding device for tools required for component supply that is an embodiment of the present disclosure.

Component supply device 14 is configured mainly from multiple tape feeders 20 (also referred to as "feeders") that position a component at a supply position to be picked up by the component mounting head, and multiple tape reels 22 and 24 (also referred to as "reels") on which is wound component holding tape T supplied to the multiple feeders 20. Component supply cart 26 (also referred to as "cart 26") used as the holding device for tools required for component supply is a configuration element of component supply device 14, and holds items such as multiple feeders 20 and multiple reels 22 and 24 that are tools required for component supply. However, in FIGS. 1 and 2, only one each of feeders 20 and reels 22 and 24 are shown; actually, multiple feeders 20 can be set lined up in the conveyance direction of the components, and, with respect to the multiple feeders 20, in a similar manner to the feeders 20, multiple reels 22 and 24 can be set and lined up in the conveyance direction of the board. Note that, with component supply device 14, the side that supplies components, that is, the front side that is the side that faces the main body of component mounter 10, is described below with the front side taken as the front side of component supply device 14.

Figure 3:
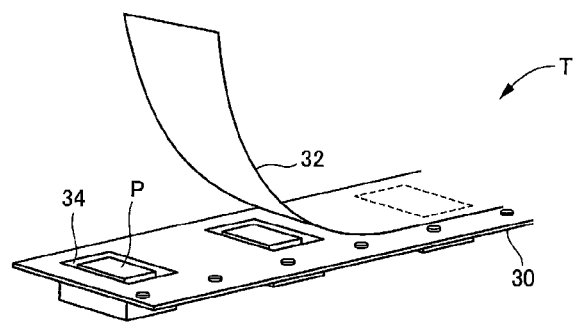
FIG. 3 is a perspective view of component holding tape.

As shown in FIG. 3, component holding tape T is configured from carrier tape 30 and cover tape 32. Multiple recess sections 34 are formed in carrier tape 30 at even intervals in the lengthwise direction, and multiple electronic circuit components P (also referred to as "P") are housed in the respective multiple recess sections. Cover tape 32 is attached to carrier tape 30 so as to cover the multiple recess sections 34, to prevent the components P from coming out of the recess sections 34.

Cart 26 is configured mainly from feeder attachment table 40 to which the above multiple feeders 20 are attached, first reel holder 42 that holds multiple reels 22, and second reel holder 44 that holds multiple reels 24. Also, cart 26 is configured such that the above feeder attachment table 40, first reel holder 42, and second reel holder 44 are attached to base 56 that includes bed 50 on which are provided a pair of wheels 48 at the front and rear, frame 52 established on that bed 50, and pair of handles 54 fixed to the frame 52.

Feeder attachment table 40 is fixed to the top end at the front side of frame 52. Feeder attachment table 40 includes multiple slots 60 for attaching the feeders 20 lined up in a left-right direction, such that multiple feeders can be held lined up in the left-direction. That is, for cart 26, component supply positions of each of the multiple feeders 20 are provided lined up in the left-right direction, that is, parallel to the conveyance direction of the board.

Also, first reel holder 42 (also referred to as "first holder 42") is fixed to frame 52 at the rear side of feeder attachment table 40, such that the upper end of reel 22 set on first reel holder 42 is roughly at the same height as feeder 20. First holder 42 includes slots 62 for each holding reels 22 lined up in the left-right direction, with the quantity being the same as the multiple slots 60 included on feeder attachment table 40. That is, first holder 42 is able to hold the same quantity of reels 22 as the quantity of feeders 20 that can be set at feeder attachment table 40. First holder 42 is configured including pair of side plates 64, and multiple support rollers 66 provided connecting the pair of side plates 64; reel 22 is held to be rotatable around a center axis line thereof by the multiple support rollers 66. Note that, in the descriptions below, reel 22 held by first holder 42 is sometimes referred to as "first reel 22."

Second reel holder 44 (also referred to as "second holder 44") is provided below first holder 42. Similar to first holder 42, second holder 44 includes slots 70 for each holding reels 24 lined up in the left-right direction, with the quantity being the same as the multiple slots 60 included on feeder attachment table 40. That is, similar to first holder 42, second holder 44 is able to hold the same quantity of reels 22 as the quantity of feeders 20 that can be set at feeder attachment table 40. Also, similar to first holder 42, second holder 44 is configured including pair of side plates 72, and multiple support rollers 74 provided connecting the pair of side plates 72; reel 24 is held so as to be rotatable around a center axis line thereof by the multiple support rollers 74. In the descriptions below, reel 24 held on second holder 44 is sometimes referred to as "second reel 24."

Figure 4:
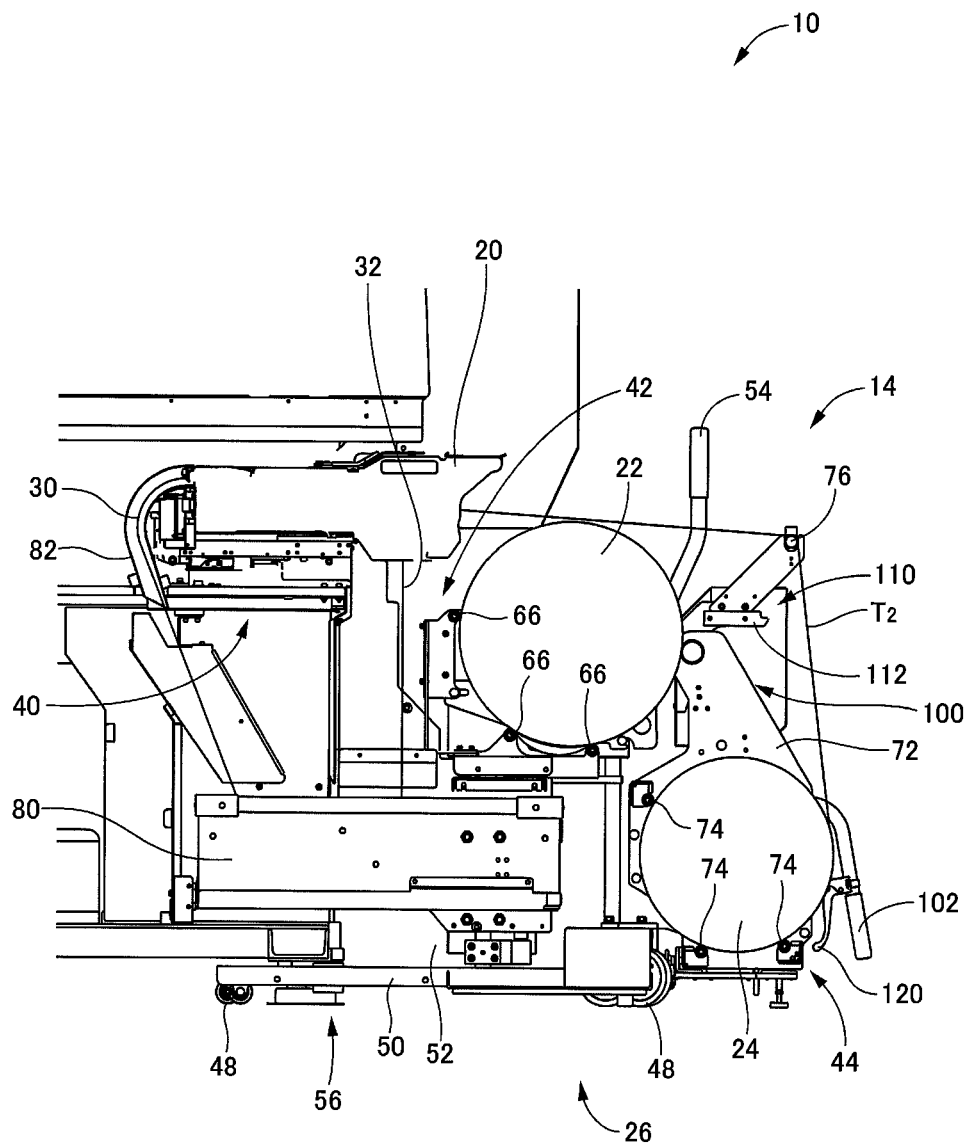
FIG. 4 shows the flow of the component holding tape in the component mounter of FIG. 1.
Figure 5:
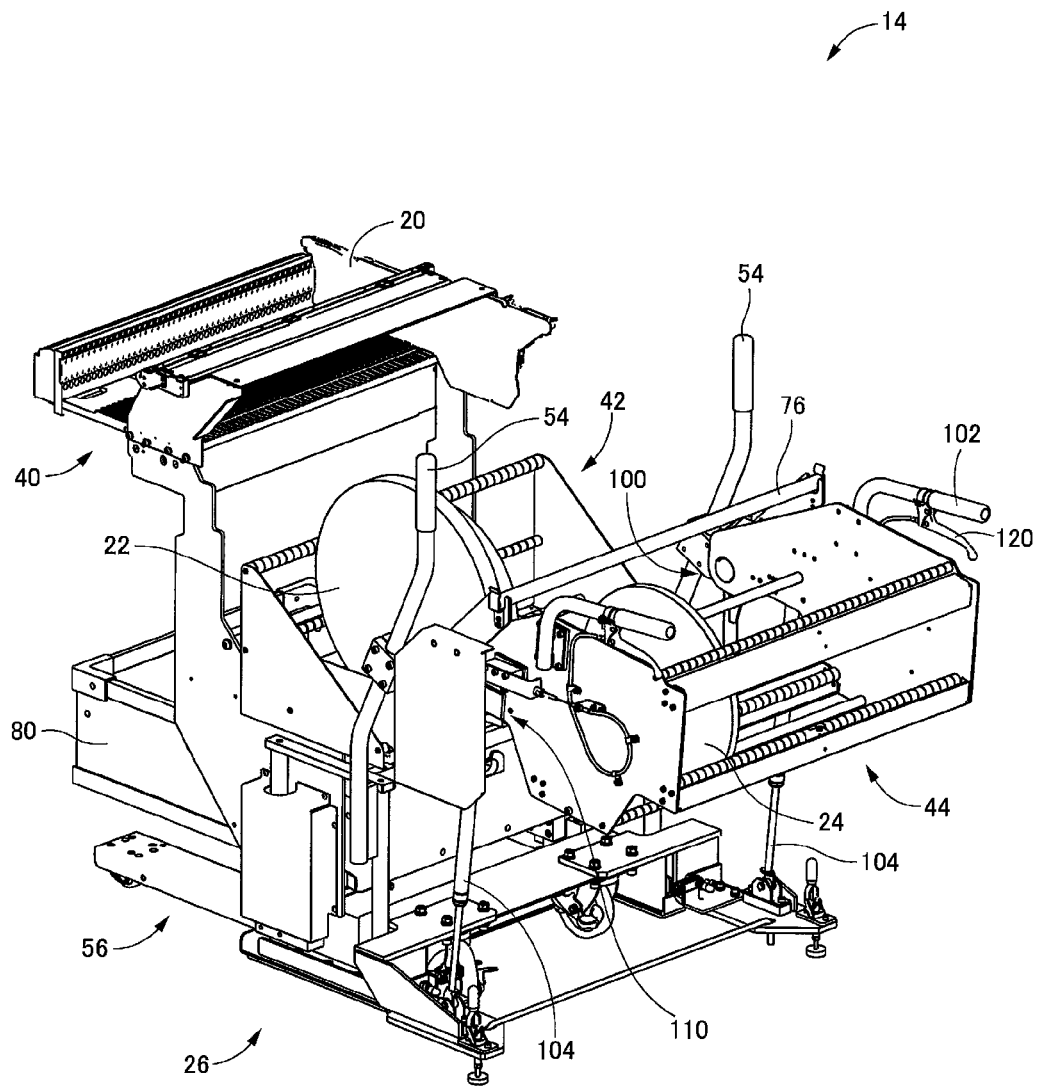
FIG. 5 is a perspective view showing the second reel holder positioned to the rear of the first reel holder in the holding device for tools required for component supply that is an embodiment of the present disclosure.

The above first holder 42 and second holder 44 are able to supply component holding tape T to a corresponding feeder 20 from a reel 22 or reel 24 held on either first holder 42 or second holder 44. As shown in FIG. 4, component holding tape T1 wound on first reel 22, is pulled out to the front, and is supplied directly to feeder 20. On the other hand, component holding tape T2 wound on second reel 24, is pulled up and is guided to feeder 20 with the direction being changed forwards by guide rollers 76. Because guide rollers 76 are provided to the rear of first holder 42 at a position higher than the upper end of first reel 22, component holding tape T2 wound on second reel 24 is supplied to feeder 20 passing above first reel 22 without contacting first reel 22.

Continuing, a simple description will be given of operation of feeder 20, with details of feeder 20 being omitted. Feeder 20 includes a feeding device, and is configured to intermittently feed component holding tape T forwards while pulling it from first reel 22 or second reel 24. Feeder 20 successively positions the multiple components held in component holding tape T to a component supply position provided at a front end section of feeder 20, so as to supply the components to a component mounting head. Note that, feeder 20 includes a cover tape peeling device that peels cover tape 32 from carrier tape 30 at a position in front of the component supply position.

Then, waste tape that is tape after components have been picked up from component supply tape T, that is, carrier tape 30 and cover tape 32, is guided to waste tape collection box 80 (also referred to as "collection box 80") that is a waste tape collection device provided on cart 26, and is collected inside collection box 80. In detail, collection box 80 is provided on cart 26 below feeders 20 and is held so as to be slidable forwards and backwards. As shown in FIG. 4, carrier tape 30 after components have been picked up is fed further forwards by the feeding device of feeder 20, the direction is changed downwards to guide 82 provided on the main body of component mounter 10, is cut to an appropriate length by a tape cutter (not shown) provided in the main body of component mounter 10, and is collected in collection box 80. On the other hand, as shown in FIG. 4, cover tape 32 peeled from carrier tape 30 by the cover tape peeling device, is fed backwards inside feeder 20, the direction is changed downwards at the rear end section of feeder 20, and is collected in collection box 80.

With component mounter 10, during component mounting operation, it is necessary to dispose of waste tape that has been collected in collection box 80, that is, it is necessary to empty collection box 80. However, collection box 80 is positioned in front of second holder 44, so in a state shown in FIGS. 2 and 4, it is impossible to remove collection box 80 from cart 26. Cart 26 of the present embodiment is provided with second holder movement allowance mechanism 100 that allows second holder 44 to be moved upwards. Second holder movement allowance mechanism 100 rotatably supports second holder 44 at an upper end section thereof, and allows second holder 44 to move to the rear of first holder 42 by second holder 44 being rotated. Specifically, the upper end of the pair of side plates 72 that configure second holder 44 are each rotatably attached to the pair of handles 54, such that second holder 44 is rotatable. Second holder 44 is configured to be moved upwards by being raised by an operator. Note that, a pair of grips 102 is provided on second holder 44, and a pair of gas springs 104 are provided between second holder 44 and bed 50, such that an operator can lift second holder 44 easily and safely.

Figure 6:
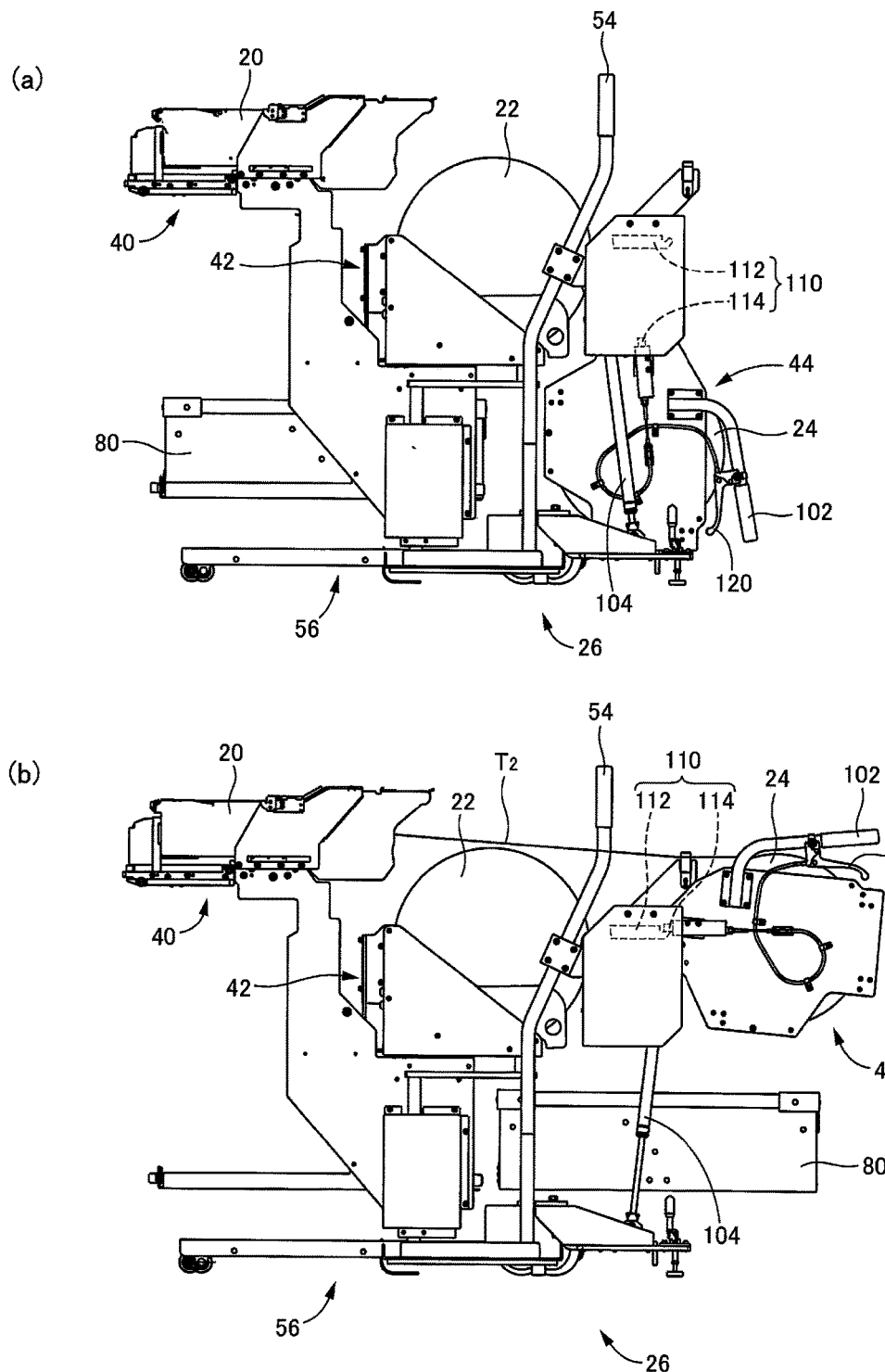
FIGS. 6(a) and 6(b) are side views of the component supply device that uses the holding device for tools required for component supply that is an embodiment of the present disclosure.

Also, cart 26 of the present embodiment is provided with second holder fixing mechanism 110 that fixes second holder 44 in a state to the rear of first holder 42. Specifically, second holder fixing mechanism 110, as shown in FIG. 6(b), is configured including engaging section 112 fixedly provided on each of the pair of handles 54, and engaged section 114 that engages with engaging section 112 and is fixed to each of the pair of side plates 72, and movement of second holder 44 is prevented by engaging section 112 engaging with engaged section 114 when second holder 44 is rotated and raised to a position to the rear of first holder 42. Thus, according to cart 26 of the present embodiment, by causing second holder 44 to be in the raised position shown in FIG. 6(b), it is possible to slide waste tape collection box 80 rearwards and to easily remove waste tape collection box 80 from the rear side of cart 26. Note that, lever 120 is provided on each of the pair of grips 102, and the engagement of engaging section 112 and engaged section 114 can be released by gripping lever 120.

Further, with cart 26 of the present embodiment, as shown in FIG. 6(b), even in a state with second holder 44 positioned to the rear of first holder 42, it is possible to supply component holding tape T2 to feeder 20 from second reel 24 held by second holder 44. Accordingly, when using cart 26 of the present embodiment, it is possible to remove waste tape collection box 80 without stopping work by component mounter 10.

Note that, with cart 26 of the present embodiment, except for when removing waste tape collection box 80, as shown in FIG. 6(a), by positioning second holder 44 below first holder 42, the space occupied by component supply device 14 is smaller, such that the space occupied by component mounter 10 is also small.

REFERENCE SIGNS LIST

10: component mounter; 14: component supply device; 20: tape feeder; 22: first tape reel; 24: second tape reel; 26: component supply cart (holding device for tools required for component supply); 30: carrier tape; 32: cover tape; 40: feeder attachment table; 42: first reel holder; 4: second reel holder; 76: guide roller (guide); 80: waste tape collection box (waste tape collection device); 100: second holder movement allowance mechanism; 102: pair of grips; 104: pair of gas springs; 110: second holder fixing mechanism; 112: engaging section; 114: engaged section; 120: lever

The invention claimed is:

1. A holding device for tools required for component supply comprising:
   a feeder attachment table on which multiple tape feeders are attached lined up in a lengthwise direction, the tape feeders being configured to feed component holding tape that holds multiple components and position multiple of the components respectively at a supply position;
   a first reel holder provided at a rear side of the feeder attachment table and configured to hold lined up multiple tape reels on which the component holding tape is wound;
   a second reel holder provided below the first reel holder and configured to hold lined up multiple of the tape reels;
   a second holder movement allowance mechanism configured to allow the second reel holder to move upwards from a first position to a second position which is higher than the first position; and
   a waste tape collection device arranged below the feeder attachment table and in front of the second reel holder, and configured to collect waste tape that is tape after components have been picked up from the component holding tape,
   wherein
   the second reel holder is positioned further rearward of the first reel holder in the second position than in the first position.

2. The holding device for tools required for component supply according to claim 1, wherein
   the component holding tape is supplied to any of the multiple tape feeders from the tape reel held by any one of the first reel holders and the second reel holders.

3. The holding device for tools required for component supply according to claim 1, wherein
   the component holding tape is supplied to any of the multiple tape feeders from the tape reel held by the second reel holder in a state with the second reel holder positioned at the rear side of the first reel holder.

4. The holding device for tools required for component supply according to claim 1,
wherein
when the second reel holder is in the second position, the waste tape collection device is removable rearwardly.

5. The holding device for tools required for component supply according to claim 1, wherein
the second holder movement allowance mechanism supports the second reel holder rotatably at an upper portion of the second reel holder, and movement to the second position from the first position is allowed by rotation of the second reel holder.

6. The holding device for tools required for component supply according to claim 1, further comprising:
a second holder fixing mechanism configured to fix the second reel holder in a state in which the second reel holder is in the second position.

7. The holding device for tools required for component supply according to claim 1, further comprising:
a guide provided to the rear of the first reel holder and at a position higher than an upper end of the tape reel held by the first reel holder,
wherein,
by the component holding tape pulled up from the tape reel held by the second tape holder being made to face forwards by the guide, the component holding tape wound on the tape reel held by the second tape holder is supplied to one of the multiple tape feeders passing above the tape reel held by the first reel holder.

8. A holding device for tools required for component supply comprising:
a feeder attachment table on which multiple tape feeders are attached lined up in a lengthwise direction, the tape feeders being configured to feed component holding tape that holds multiple components and position multiple of the components respectively at a supply position;
a first reel holder provided at a rear side of the feeder attachment table and configured to hold lined up multiple tape reels on which the component holding tape is wound;
a second reel holder provided below the first reel holder and configured to hold lined up multiple of the tape reels;
a second holder movement allowance mechanism configured to allow the second reel holder to move upwards; and
a waste tape collection device arranged below the feeder attachment table and in front of the second reel holder, and configured to collect waste tape that is tape after components have been picked up from the component holding tape,
wherein
the second reel holder is able to be positioned at a rear side of the first reel holder, and
in a state with the second reel holder positioned at the rear of the first reel holder, the waste tape collection device is removable rearwardly.

9. A holding device for tools required for component supply comprising:
a feeder attachment table on which multiple tape feeders are attached lined up in a lengthwise direction, the tape feeders being configured to feed component holding tape that holds multiple components and position multiple of the components respectively at a supply position;
a first reel holder provided at a rear side of the feeder attachment table and configured to hold lined up multiple tape reels on which the component holding tape is wound;
a second reel holder provided below the first reel holder and configured to hold lined up multiple of the tape reels;
a second holder movement allowance mechanism configured to allow the second reel holder to move upwards; and
a guide provided to the rear of the first reel holder and at a position higher than an upper end of the tape reel held by the first reel holder,
wherein
the second reel holder is able to be positioned at a rear side of the first reel holder, and
by the component holding tape pulled up from the tape reel held by the second tape holder being made to face forwards by the guide, the component holding tape wound on the tape reel held by the second tape holder is supplied to one of the multiple tape feeders passing above the tape reel held by the first reel holder.

* * * * *